(12) United States Patent
Munakata et al.

(10) Patent No.: US 6,562,649 B2
(45) Date of Patent: May 13, 2003

(54) COMPOUND SEMICONDUCTOR LIGHT EMITTING DEVICE AND PROCESS FOR PRODUCING THE SAME

(75) Inventors: Tsutomu Munakata, Tokyo (JP); Yasumasa Kashima, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/227,412

(22) Filed: Aug. 26, 2002

(65) Prior Publication Data
US 2003/0002554 A1 Jan. 2, 2003

Related U.S. Application Data

(62) Division of application No. 09/161,227, filed on Sep. 28, 1998, now Pat. No. 6,470,038.

(30) Foreign Application Priority Data
Oct. 20, 1997 (JP) .............................................. 9-287311

(51) Int. Cl.[7] .............................................. H01L 21/00
(52) U.S. Cl. .............................. 438/46; 438/44; 438/47
(58) Field of Search ............................. 438/46, 47, 44, 438/606, 607

(56) References Cited

U.S. PATENT DOCUMENTS

| | | | |
|---|---|---|---|
| 4,849,372 A | * | 7/1989 | Takemoto .................... 437/129 |
| 5,228,048 A | | 7/1993 | Takemoto et al. |
| 5,400,354 A | * | 3/1995 | Ludowise et al. ............. 372/46 |
| 5,616,948 A | | 4/1997 | Pfiester |
| 5,723,360 A | * | 3/1998 | Iwasaki ........................ 437/107 |
| 5,882,948 A | * | 3/1999 | Jewell ............................ 438/22 |
| 6,013,539 A | * | 1/2000 | Kashima et al. ............... 438/31 |
| 6,130,147 A | * | 10/2000 | Major et al. .................. 438/604 |
| 6,277,696 B1 | * | 8/2001 | Carey et al. .................. 438/289 |

FOREIGN PATENT DOCUMENTS

| | | |
|---|---|---|
| JP | 5-90700 | 4/1993 |
| JP | 6-120615 | 4/1994 |
| JP | 07-022692 | 1/1995 |
| JP | 7-131116 | 5/1995 |
| JP | 09-298334 | 11/1997 |

\* cited by examiner

Primary Examiner—Alexander Ghyka
(74) Attorney, Agent, or Firm—Volentine Francos, PLLC (57) ABSTRACT

A compound semiconductor light emitting device that can keep the effect of confining carriers into an active layer and that can improve light emission efficiency. In the device having a first conductive type substrate; and active layer on the first conductive type substrate; a second conductive type sub-layer and a first conductive type sub-layer, in this order from a lower portion to an upper portion of the device, on the first conductive type substrate and at both sides of the active layer; a second conductive type cladding layer on/over the active layer and the first conductive type sub-layer; and a second conductive type contact layer on the second conductive type cladding layer 19. A p-type diffusion barrier layer is further formed between the n-type sub-layer and the p-type cladding layer.

9 Claims, 4 Drawing Sheets

COMPOUND SEMICONDUCTOR LIGHT EMITTING DEVICE AND PROCESS FOR PRODUCING THE SAME

CROSS REFERENCE TO RELATED APPLICATIONS

This is a divisional application of application Ser. No. 09/161,227, filed Sep. 28, 1998 now U.S. Pat. No. 6,470,038, which is hereby incorporated by reference in its entirety for all purposes.

BACKGROUND OF THE INVENTION

1. Field of the Invention

The present invention relates to a compound semiconductor light emitting device, and in particular to a compound semiconductor light emitting device which can be suitably applied to an InP-semiconductor laser having a BH structure (Buried Hetero-structure); and a process for producing the same.

2. Description of the Related Art

Figure 4:
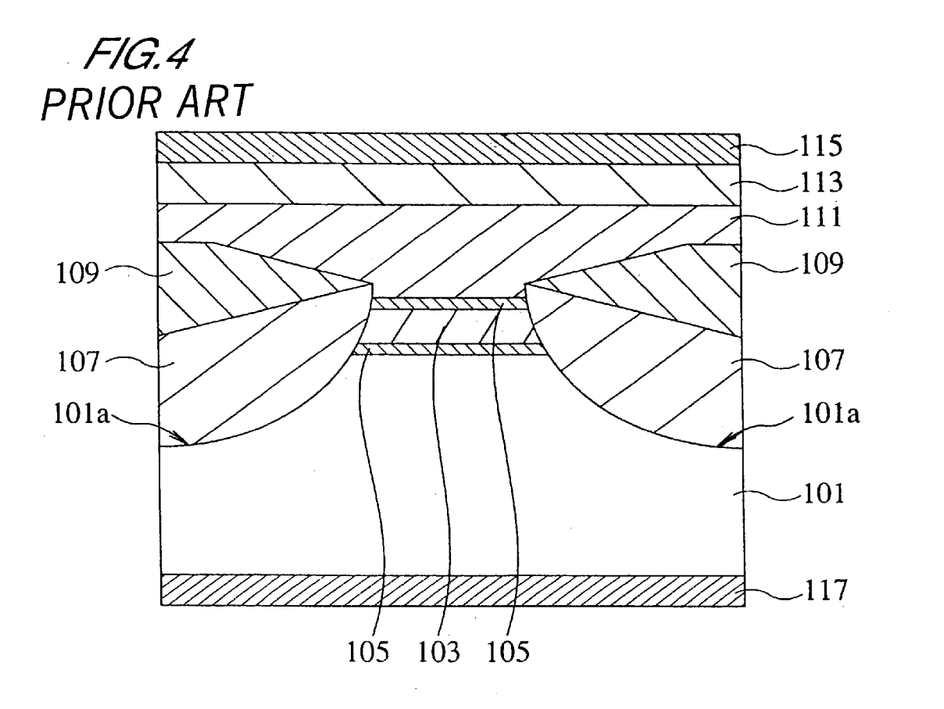
FIG. 4 is a schematic light-radiating end face of a compound semiconductor light emitting device, which is provided for explanation of the prior art.

Hitherto, a device having the following structure has been known as an InP-semiconductor laser having a BH structure. This device will be described referring to FIG. 4. FIG. 4 is a schematic light-emitting end face of an InP-BH structure type semiconductor laser in the prior art.

This device has an InGaAsP active layer 103 in a stripe form over an n-type InP substrate 101. On the upper and lower surfaces of the active layer 103, InGaAsP guide layers 105 are formed which have such a composition that the guide layers 105 have larger band gaps than the active layer 103. On the n-type substrate portions 101a at both sides of the active layer 103, there are formed a p-type InP sub-layer 107 having a carrier concentration of $5 \times 10^{17}$ cm$^{-3}$, and an n-type InP sub-layer 109 having a carrier concentration of $1 \times 10^{18}$ cm$^{-3}$, in this order from the lower to the upper. A p-type InP cladding layer 111 having a carrier concentration of $1 \times 10^{18}$ cm$^{-3}$ is formed over/on the active layer 103 and the n-type InP sub-layer 109. On the p-type InP cladding layer 111, a p-type InGaAs contact layer 113 is deposited. Electrodes 115 and 117 are formed on the upper surface of the p-type InGaAs contact layer 113 and the lower surface of the n-type InP substrate 101, respectively.

In this semiconductor laser, a current path narrowing layer, that is, a current blocking layer composed of the p-type sub-layer 107 and the n-type sub-layer 109 is formed at both sides of the active layer 103. The p-type cladding layer 111 over the active layer 103, the n-type sub-layer 109, the p-type sub-layer 107 and the n-type substrate 101 constitute a pnpn structure. By this structure, the current injected to the device does not flow into other than the active layer 103.

In the p-type cladding layer 111 on/over the n-type sub-Layer 109 and the active layer 103 in such a conventional semiconductor laser, its carrier concentration is raised to $1 \times 10^{18}$ cm$^{-3}$, in order to lower the resistance of the semiconductor laser. However, when the p-type cladding layer 111 is formed, Zn, which is a p-type dopant and may be introduced as DMZn: dimethylzinc (Zn(CH$_3$)$_2$), is diffused to the n-type sub-layer 109. As a result, in the n-type sub-layer 109 holes are generated. The holes and electrons, which are n-type carriers, are combined and extinguished so that the number of the n-type carriers in the n-type sub-layer 109 is reduced. Therefore, the function as the n-type of the n-type sub-layer 109 is deteriorated. Namely, carriers are canceled out. Thus, the performance as the current blocking layer, that is, the performance of injecting currents efficiently into the active layer 103 is deteriorated, resulting in a problem that the light emission efficiency of the semiconductor laser falls.

SUMMARY OF THE INVENTION

An object of the present invention is to provide a compound semiconductor light emitting device which makes it possible to keep the effect of confining carriers into an active layer and improve light emission efficiency. Another object of the present invention is to provide a process for producing a compound semiconductor light emitting device.

Therefore, the compound semiconductor light emitting device of the present invention comprises an active layer disposed on/over a first conductive type substrate; a second conductive type sub-layer and a first conductive type sub-layer, in this order from the lower to the upper, disposed on/over the first conductive type substrate and at both sides of the active layer; a second conductive type cladding layer disposed on/over the active layer and the first conductive type sub-layer; a second conductive type contact layer disposed on/over the second conductive type cladding layer; and a second conductive type diffusion barrier layer disposed between the first conductive type sub-layer and the second conductive type cladding layer.

The second conductive type sub-layer and the first conductive type sub-layer form a current blocking layer, and, accordingly, have the function of injecting a current efficiently into the buried active layer. Therefore, each of the sub-layers may also be called as a current block layer. The second conductive type diffusion barrier layer is disposed between the first conductive type sub-layer and the second conductive cladding layer. Therefore, when the light emitting device of the present invention is produced, the diffusion of the second conductive type dopant from the second conductive type cladding layer can be confined into the second conductive type diffusion barrier layer. For this reason, the second conductive type dopant is not incorporated into the first conductive sub-layer. Thus, the first conductive type carrier in the first conductive type sub-layer does not become extinct, so that its carrier concentration does not fall. Thus, the first and second conductive type sub-layers can cooperate to keep the function as the current blocking layer, and consequently the efficiency of injecting the current into the active layer can be improved, as compared with the prior art.

Preferably, each of the first conductive type substrate, the second conductive type sub-layer, the first conductive type sub-layer, the second conductive type cladding layer and the second conductive type diffusion barrier layer may be made of InP; and each of the active layer and the second conductive type contact layer may be made of InGaAs or InGaAsP.

When the semiconductor compound light emitting device is made of the aforementioned materials, Zn (zinc) is used as the second conductive type dopant for forming any second conductive type layer. If the second conductive type cladding layer contacts the first conductive type sub-layer, it is feared that Zn is diffused from the second conductive type cladding layer to the first conductive type sub-layer during the formation of the second conductive type cladding layer. Therefore, if the second conductive type diffusion barrier layer is beforehand formed between the second conductive type cladding layer and the first conductive type sub-layer, the diffusion barrier layer can take therein Zn. Accordingly, the diffusion of Zn to the first conductive type sub-layer can be restrained. Thus, the dopant concentration in the first conductive type sub-layer is not reduced during the formation of the device, so as to result in the value as designed. As a result, the carrier concentration in the first conductive type sub-layer also results in the value as designed.

Preferably, the second conductive type diffusion barrier layer may be a layer formed as follows. Namely, this layer is firstly formed as a preparatory (or provisional) layer having a lower carrier concentration than the carrier concentration in the second conductive type cladding layer. In the subsequent steps of forming the second conductive type cladding layer, the second conductive type dopant is diffused from the second conductive type cladding layer to the preparatory layer. By this diffusion, the preparatory layer is finally turned into a layer having the same or substantially the same carrier concentration as in the second conductive type cladding layer.

According to the above, the second conductive type diffusion barrier layer becomes a layer-substantially functioning as a part of the second conductive type cladding layer in the compound semiconductor light emitting device. As a result, the first conductive type sub-layer can keep the effect as the current blocking layer. Since the second conductive type diffusion barrier layer becomes a part of the second conductive type cladding layer, no bad effect is produced on the compound semiconductor laser.

Furthermore, a process for producing a compound semiconductor light emitting device comprises: the first crystal growth step of epitaxially growing an InGaAs active layer and a second conductive type, first InP cladding layer in turn on/over a first conductive type substrate; the step of disposing an etching mask in a stripe form on/over the second conductive type, first InP cladding layer, and etching an area uncovered with the etching mask to a depth reaching the first conductive type substrate; the second crystal growth step of epitaxially growing a second conductive type InP sub-layer, a first conductive type InP sub-layer, and a second conductive type InP diffusion barrier layer in turn on/over an uncovered area of the first conductive type substrate which is uncovered with the etching mask; the step of removing off the etching mask; and the third crystal growth step of epitaxially growing a second conductive type, second InP cladding layer and a second conductive type InGaAs contact layer in turn on/over uncovered upper surfaces of the second conductive type, first InP cladding layer and the second conductive type diffusion barrier layer.

The second conductive type diffusion barrier layer can be formed in the second crystal growth step, wherein the second conductive type and first conductive type InP sub-layers are formed. Thus, increase in steps is unnecessary for forming the second conductive type diffusion barrier layer, so that the device can be easily produced.

Preferably, a dopant for the first conductive type may be $Si_2H_6$, and a dopant for the second conductive type may be zinc (Zn).

Preferably, the second conductive type InP diffusion barrier layer may be formed as follows. Firstly there is formed a preparatory (or provisional) layer having a lower carrier concentration than the carrier concentration in the second conductive type, first InP cladding layer in the first crystal growth step. After that, the second conductive type dopant is diffused from the second conductive type, second InP cladding layer to the preparatory layer, when the second conductive type, second InP cladding layer is grown, whereby the carrier concentration in the preparatory layer is made the same or substantially the same as in the second conductive type, second InP cladding layer.

According to the above, the second conductive type InP diffusion barrier layer itself substantially becomes a part of the second conductive type InP cladding layer after the second conductive type InP diffusion barrier layer itself causes restraint of the diffusion of the second conductive type.dopant to the first conductive type InP sub-layer. Accordingly, in the compound semiconductor light emitting device having substantially the same structure as such devices in the prior art, the effect of confining carriers into the active layer can be improved.

Preferably, the second conductive type InP sub-layer, the first conductive type InP sub-layer, the second conductive InP cladding layer and the preparatory layer may be formed so that the carrier concentrations in these layers will be $5\times10^{17}$ $cm^{-3}$, $1\times10^{18}$ $cm^{-3}$, $1\times10^{18}$ $cm^{-3}$, and from $5\times10^{17}$ to $7\times10^{17}$ $cm^{-3}$ (both inclusive), respectively.

More preferably, the preparatory layer may be formed so that the carrier concentration therein will be $5\times10^{17}$ $cm^{-3}$.

Furthermore preferably, when the second conductive type InP cladding layer may be formed so that the carrier concentration therein will be $1\times10^{18}$ $cm^{-3}$, the second conductive type InP diffusion barrier layer is formed so that the carrier concentration therein will be $1\times10^{18}$ $cm^{-3}$ or about $1\times10^{18}$ $cm^{-3}$.

According to the above, the second conductive type dopant is diffused into the preparatory layer, so that the carrier concentration in the preparatory layer rises. Finally, the carrier concentration in the second conductive type InP diffusion barrier layer becomes substantially the same as that in the second conductive type InP cladding layer. At this time, the diffusion of the second conductive type dopant is finished, thereby restraining the diffusion of the second conductive type dopant into the first conductive type InP sub-layer positioned below the preparatory layer. Furthermore, the above makes it possible to make the second conductive type InP diffusion barrier layer into a layer functioning as a part of the second conductive type InP cladding layer in the compound semiconductor light emitting device.

It is preferred that the first conductive type may be made into an n-type and the second conductive type may be made into a p-type.

It is also preferred that the etching mask may be made of a $SiO_2$ or SiN film.

It is also preferred that the aforementioned film may be formed by a CVD process.

Furthermore, it is preferred that the crystal growth in the first, second and third crystal growth steps may be carried out by using a vapor phase or liquid phase growth process.

The vapor phase process may be, for example, an MOVPE (Metal Organic Vapor-Phase Epitaxy) process.

BRIEF DESCRIPTION OF THE DRAWINGS

The forgoing and other objects, features and advantages of the present invention will be better understood from the following description taken in connection with accompanying drawings, in which.

DESCRIPTION OF THE PREFERRED EMBODIMENTS

Embodiments of the present invention will be described below, referring to the attached drawings. Respective drawings schematically illustrate constitutional elements of the present invention to such an extent that the present invention can be understood; therefore, the present invention is not limited to the present embodiments illustrated in the drawings. In each of the drawings, hatching, which generally shows sections, is omitted except in a part of an illustrated section so that the drawing can be easily understood.

The following will describe an example of a specific structure of a compound semiconductor light emitting device comprising an active layer on/over the first conductive type substrate; the second conductive type sub-layer and the first conductive type sub-layer, in this order viewed from the lower to the upper, on the first conductive type substrate and at both sides of the active layer; the second conductive type cladding layer on/over the active layer and the first conductive type sub-layer; the second conductive type contact layer on/over the second conductive type cladding layer; and the second conductive type diffusion barrier layer between the first conductive type sub-layer and the second conductive type cladding layer; and a process for producing the light emitting device, referring to the drawings. Herein, an InP-BH structure type semiconductor laser is given as an example of the compound semiconductor light emitting device.

Figure 1:
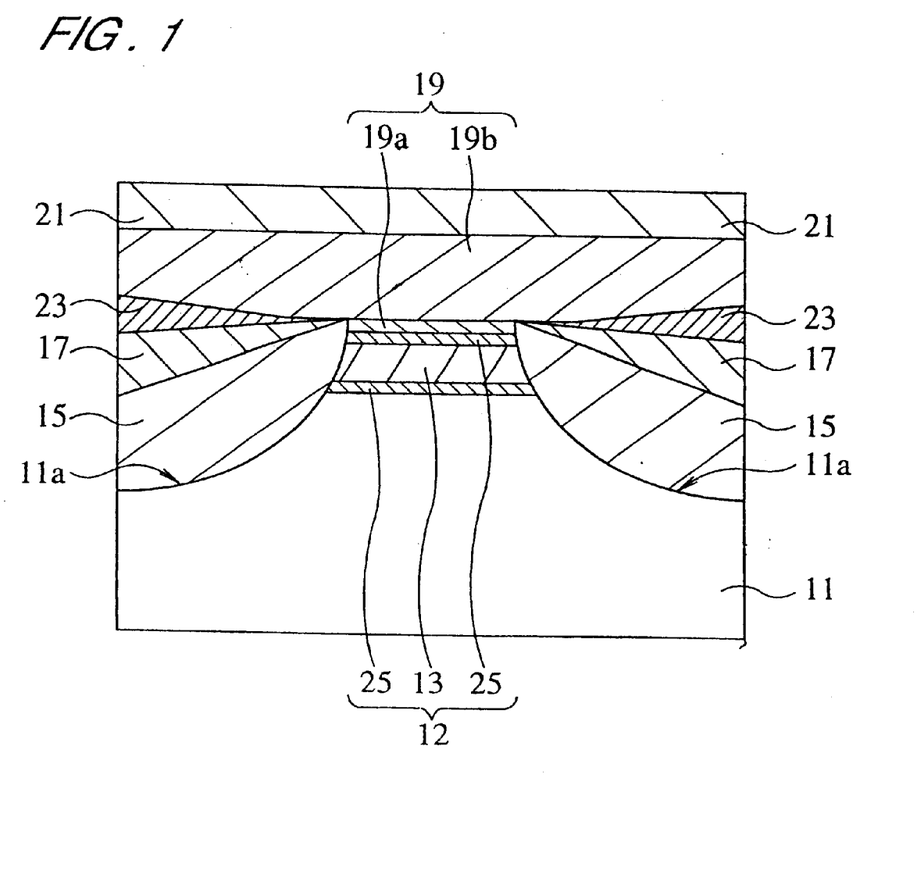
FIG. 1 is a schematic cross section of the main portion of a compound semiconductor light emitting device, which is provided for explanation of an embodiment of the present invention.
Figure 2A:
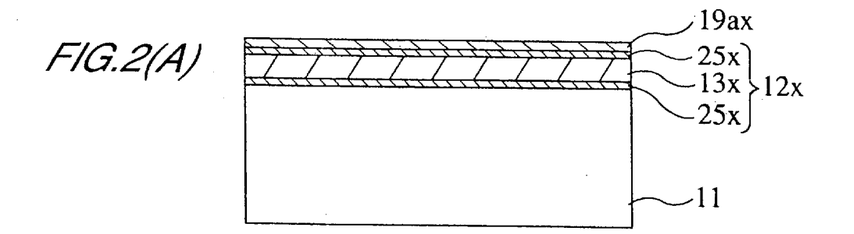
FIGS. 2(A)–(D) are views illustrating steps of producing the compound semiconductor light emitting device, which are provided for explanation of the present embodiment of the present invention, and are cross sections corresponding to FIG. 1.
Figure 2B:
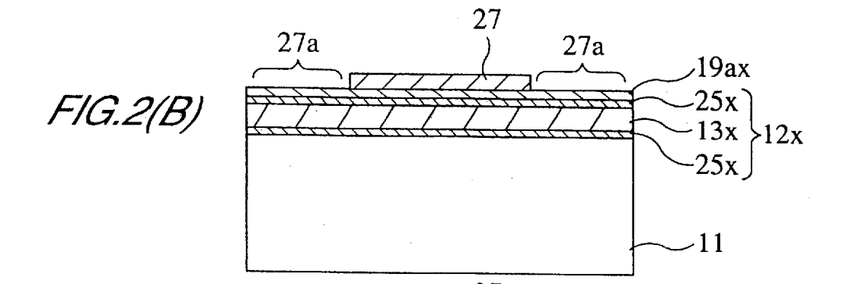
Figure 2C:
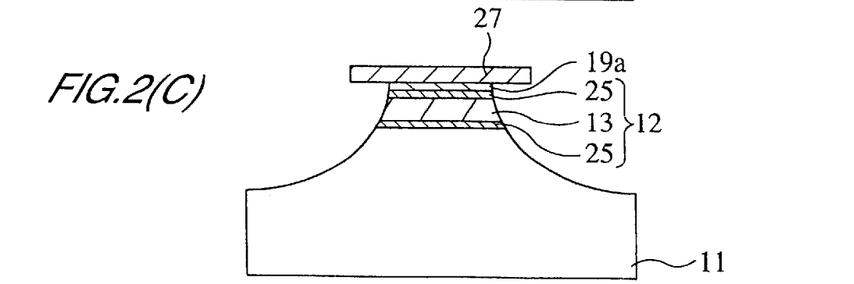
Figure 2D:
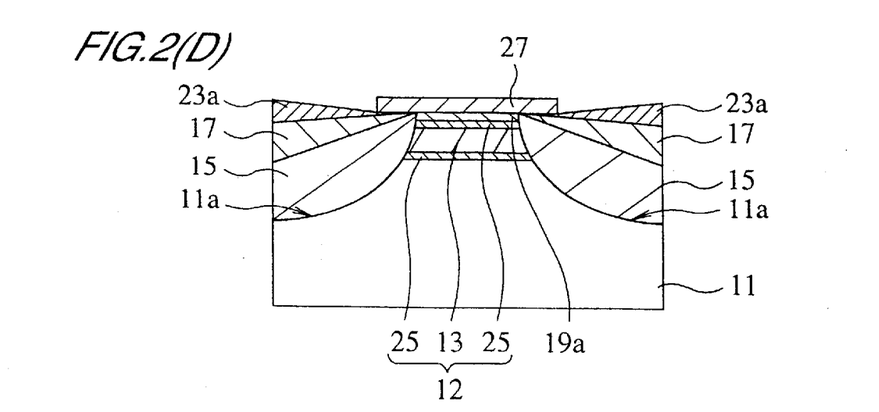
Figure 3A:
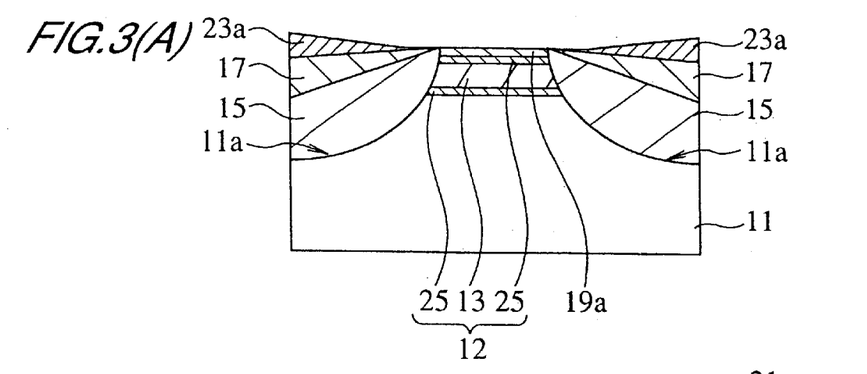
FIGS. 3(A)–(C) are views illustrating steps of producing the compound semiconductor light emitting device and after the steps illustrated in FIG. 2, which are provided for explanation of the present embodiment of the present invention.
Figure 3B:
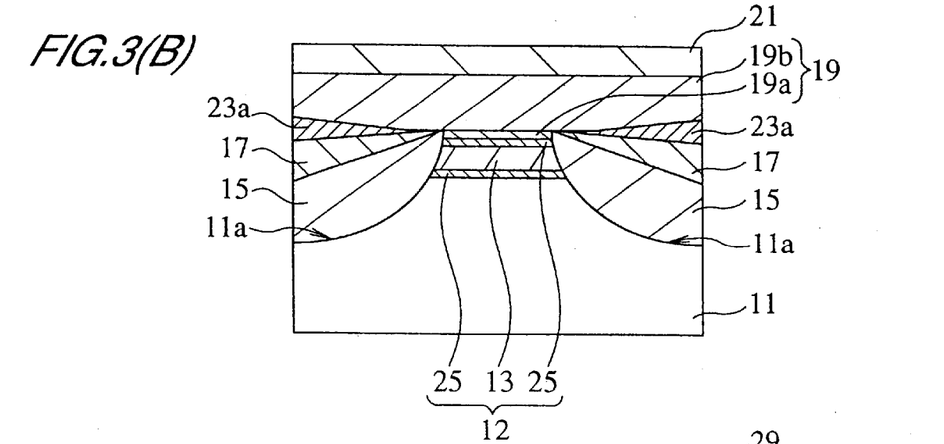
Figure 3C:
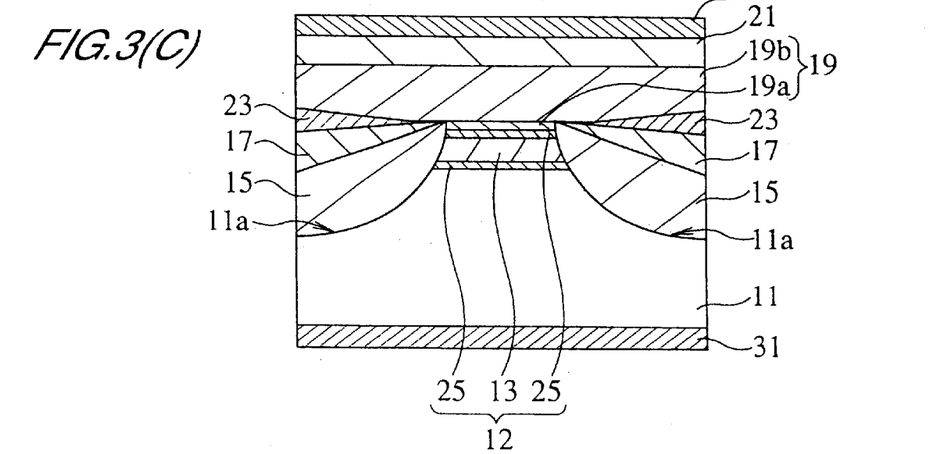

FIG. 1 is a cross section illustrating a main structure of the compound semiconductor light emitting device according to the present embodiment, and shows a section cut along a line perpendicular to the direction along which the active layer in a strip form extends. FIGS. 2 and 3 illustrate main steps of a process for producing this compound semiconductor light emitting device, in turn, and are cross sections corresponding to FIG. 1.

Firstly, the process for producing the InP—BH structure type semiconductor laser as the compound semiconductor light emitting device will be described. In the illustrated embodiment, the first conductive type is an n-type, and the second conductive type is a p-type.

In the first crystal growth step, an InGaAs or InGaAsP active layer 12 and a p-type (second conductive type) first InP cladding layer 19a are epitaxially grown in order on an n-type (first conductive type) substrate 11. To accomplish the above, a film 12x for the active layer is firstly deposited on the n-type InP substrate 11 under the condition that temperature is 610° C. and pressure is 55 Torr by an MOVPE process. In the present embodiment, the film 12x for the active layer is composed of two films 25x for guide layers, and a film 13x for a quantum well layer whose upper and lower surfaces are sandwiched between these films 25x for the guide layers [FIG. 2 (A)]. The films 25x for the guide layers are made of InGaAsP. The film 13x for the quantum well layer is made of InGaAs and InGaAsP. The films 25x for the guide layers are different from the film 13x for the quantum well layer in composition. The film 12x for the active layer has such a composition that the film 12x has a smaller band gap than the film 13x for the quantum well layer. For example, the film 13x for the quantum well layer is composed of a multi-layer of $In_{0.62}Ga_{0.38}As$ (compressive strain: 0.6%, $\lambda g=1.4$ μm) and $In_{0.70}Ga_{0.30}As_{0.65}P_{0.35}$, and the films 25x for the guide layers are composed of $In_{0.82}Ga_{0.18}As_{0.40}P_{0.60}$ ($\lambda g=1.2$ μm).

Subsequently, a film 19ax for a p-type first InP cladding layer is epitaxially grown over the film 12x for the active layer, that is, on the upper film 25x for the guide layer under substantially the same temperature and pressure as in forming the film 12x for the active layer. In order to make the film 19ax into a p-type film, Zn (zinc) is used as a p-type dopant with which the film 19ax is doped. DMZn (dimethylzinc) is used as a source for obtaining the dopant Zn. The doping amount of the dopant is adjusted so that the carrier concentration in the film 19ax for the p-type first InP cladding layer will be $1 \times 10^{18}$ cm$^{-3}$ [FIG. 2(A)].

An etching mask 27 in a strip form is disposed on the upper surface of the film 19ax for the p-type first InP cladding layer. In the present embodiment, a $SiO_2$ film is deposited on the upper surface of the film 19ax for the p-type first InP cladding layer by a CVD process, and then photolithography is used to form the etching mask 27 composed of the $SiO_2$ film in a stripe form. In the present embodiment, the width of the etching mask 27 (the width of the stripe) is from 1.8 to 2.0 μm [FIG. 2(B)].

The area 27a which is uncovered with the etching mask 27 is subjected to etching treatment, so that the etching will reach at least the n-type substrate 11. In the present embodiment, wet etching treatment is conducted to such a depth that the etching will reach at least the n-type InP substrate 11, specifically to the depth of from 2–3 μm. Thus, a mesa structure is formed [FIG. 2(C)]. The mesa form portion remaining after the etching treatment constitutes the active layer 12 composed of the quantum well layer 13 and the guide layers 25 between which the quantum well layer 13 is sandwiched; and the p-type first InP cladding layer 19a [FIG. 2(C)]. In this etching treatment, the portion under the etching mask 27 is excessively etched and removed off. In the structure after the etching treatment, therefore, the etching mask 27 has an overhanging form [FIG. 2(C)].

Next, the second crystal growth step is carried out. In this step, a p-type InP current block layer (that is, sub-layer) 15, an n-type InP current block layer (that is, sub-layer) 17 and a preparatory or provisional layer 23a of a p-type InP diffusion barrier layer are epitaxially grown in turn on the uncovered portion 11a of the n-type substrate 11, which is uncovered with the etching mask 27. The growth of these layers is carried out under the same condition as in the first crystal growth step (temperature: 610° C., pressure: 55 Torr) by MOVPE process. At this time, in order to make the p-type InP sub-layer 15 and the p-type diffusion barrier layer 23 into p-type layer, Zn is used as a p-type dopant, with which these layers are doped. DMZn is used as a dopant source.

In the present embodiment, to accomplish the above, the p-type InP sub-layer 15 is epitaxially grown on the area 11a while being doped with Zn. Thus, the p-type InP sub-layer 15 is formed on the area 11a. In the present embodiment, the doping amount of Zn is adjusted so that the carrier concentration in the p-type InP sub-layer 15 will be $5 \times 10^{17}$ cm$^{-3}$ and the thickness thereof will be from 1.0 to 1.5 μm.

Subsequently, the n-type InP sub-layer 17 is epitaxially grown on the p-type InP sub-layer 15. In order to make this layer 17 into an n-type layer, for example, $Si_2H_6$(disilane) is used as an n-type dopant with which the layer 17 is doped.

In the present embodiment, the amount of $Si_2H_6$, with which the n-type InP sub-layer 17 is doped, is adjusted so that the carrier concentration in the layer 17 will be $1\times10^{18}$ cm$^{-3}$ and the thickness thereof will be from 0.5 to 0.7 μm.

After that, the preparatory layer 23a of the p-type InP diffusion barrier layer 23 is epitaxially grown on the n-type InP sub-layer 17. The doping amount of Zn is adjusted so that the carrier concentration in the preparatory layer 23a will be lower than that in the p-type first InP cladding layer 19a. In the present embodiment, the carrier concentration in the preparatory layer 23a is $5\times10^{17}$ cm$^{-3}$, and the thickness of the layer 23a is from 0.1 to 0.2 μm. It is preferred that the upper face of the preparatory layer 23a may be flat and continue to the upper face of the film 19a for the first cladding layer.

The layers 15, 17 and 23a deposited in turn in the second crystal growth step are formed so that the mesa form side ends of these layers substantially contact the upper end of each side of the p-type first InP cladding layer. Thus, the p-type InP sub-layer 15 and the n-type InP sub-layer 17 constitute a current blocking layer. By this current blocking layer, efficient injection of electric currents to the active layer 12 is accomplished [FIG. 2(D)]. As shown in FIG. 2(D), the current blocking layer (layers 15 and 17) can be formed at the both sides of the active layer 12 so as to sandwich the active layer 12, by aid of the remaining etching mask 27 in an overhanging form.

The etching mask 27 is then removed off. In the present embodiment, the etching mask 27 is removed off by wet etching treatment with an acidic solution [FIG. 3(A)].

In the next step, that is, in the third crystal growth step, the p-type second InP cladding layer 19b and a p-type InGaAs contact layer 21 are epitaxially grown in turn on the uncovered upper surfaces of the p-type first InP cladding layer 19 and the preparatory layer 23a of the p-type InP diffusion barrier layer. This crystal growth is carried out under the same condition as in the first and second crystal growth steps (temperature: 610° C., pressure: 55 Torr).

Firstly, the p-type second InP cladding layer 19b is grown on the upper surface of each of the p-type first InP cladding layer 19a and the preparatory layer 23a. The doping amount of Zn is adjusted so that the carrier concentration in the p-type second cladding layer 19b will be $1\times10^{18}$ cm$^{-3}$. In this case, the dose of Zn should be adjusted, counting on the diffusing amount of Zn to the preparatory layer 23a.

Subsequently, the p-type InGaAs contact layer 21 is grown on the p-type second InP cladding layer 19b. The doping amount of Zn is adjusted so that the carrier concentration in the contact layer 21 will be $5\times10^{18}$ cm$^{-3}$ [FIG. 3(B)]. The carrier concentrations in the p-type second InP cladding layer 19b and the p-type InGaAs contact layer 21 are made high, in order that currents can be easily injected into the active layer 12 by lowering the resistance of the light emitting device.

When the aforementioned p-type second cladding layer 19b is epitaxialy grown, the p-type dopant, Zn is diffused from the p-type second cladding layer 19 which is being grown or has been already grown to the preparatory layer 23a of the p-type diffusion barrier layer 23. As a result, the carrier concentration in the preparatory layer 23a becomes substantially equal to that in the p-type second cladding layer 19b. Thus, when the growth of the p-type second cladding layer 19b is finished, the dose of the p-type dopant in the preparatory layer 23a just becomes an amount such that the carrier concentration will be turned to $1\times10^{18}$ cm$^{-3}$, or an amount corresponding to $1\times10^{18}$ cm$^{-3}$. Thus, the preparatory layer 23a is turned into the p-type InP diffusion barrier layer 23. The carrier concentration in the p-type second InP cladding layer 19b is also turned to $1\times10^{18}$ cm$^{-3}$ by the remaining Zn.

Through the aforementioned processes, the structure illustrated in FIG. 1 is obtained. After this, in order to make this structure into a semiconductor laser, a p-type electrode 29 is disposed on the upper surface of the p-type InGaAs contact layer 21, and an n-type electrode 31 is also disposed on the lower surface of the n-type InP substrate 11 [FIG. 3(C)]. As raw materials for the p-type electrode 29 and the n-type electrode 31, for example, AuZn and AuGeNi are used, respectively.

According to the process of the present invention, diffusion of the p-type dopant (such as DMZn) from the p-type cladding layer 19 is confined to the preparatory layer 23a when this layer 19 is formed. This is because the preparatory layer 23a is disposed between the n-type sub-layer 17 and the p-type cladding layer 19. Thus, the diffusion of the p-type dopant to the n-type sub-layer 17 can be restrained. For this reason, it is possible to prevent extinction of n-type carriers caused by incorporation of the p-type dopant into the n-type sub-layer 17, and the drop in the carrier concentration in the layer 17.

Referring to FIG. 1, the following will describe the main structure of the compound semiconductor light emitting device according to the present invention, which is produced by the aforementioned process.

This device has the n-type substrate 11; the active layer 12 on the n-type substrate 11; the p-type sub-layer (that is, current block layer) 15 and the n-type sub-layer (that is, current block layer) 17, in this order from the lower to the upper, on the n-type substrate 11 and at both sides of the active layer 12; the p-type cladding layer 19 on/over the active layer 12 and the n-type sub-layer 17; the p-type contact layer 21 on the p-type cladding layer 19; and the p-type diffusion barrier layer 23 between the n-type sub-layer 17 and the p-type cladding layer 19.

The material for the n-type substrate 11, the p-type sub-layer 15, the n-type sub-layer 17, the p-type cladding layer 19 and the p-type diffusion barrier layer 23 is InP; the material for the active layer 12 is InGaAs and InGaAsP; and the material for the p-type contact layer 21 is InGaAs.

In the present embodiment, the active layer 12 is composed of the two upper and lower guide layers 25, and the quantum well layer 13 sandwiched between these guide layers 25. The guide layers 25 are made of InGaAsP, and the quantum well layer 13 is made of InGaAs and InGaAsP. The composition of the guide layers 25 is different from that of the quantum well layer 13. The quantum well layer 13 has such a composition that the layer 13 has a smaller band gap than the guide layers 25. For example, the quantum well layer 13 is composed of a multi-layer of $In_{0.62}Ga_{0.38}As$ and $In_{0.70}Ga_{0.30}As_{0.65}P_{0.35}$, and the guide layers 25 are composed of $In_{0.82}Ga_{0.18}As_{0.40}P_{0.60}$.

As already described, the p-type cladding layer 19 is composed of the p-type first cladding layer 19a and the p-type second cladding layer 19b.

The p-type sub-layer 15 and the n-type sub-layer 17 form a current blocking layer, and play a role for injecting currents efficiently into the buried active layer 12.

As already described, the p-type diffusion barrier layer 23 is firstly formed as the preparatory layer having a smaller carrier concentration than the carrier concentration in the p-type cladding layer 19, and is a layer obtained by diffusing the p-type dopant from the p-type cladding layer 19 to this preparatory layer thereby finally turning the preparatory layer into a layer having substantially same carrier concentration as in the p-type cladding layer 19.

When the carrier concentrations in the p-type sub-layer 15, the n-type sub-layer 17 and the p-type cladding layer 19 are set to $5\times10^{17}$ cm$^{-3}$, $1\times10^{18}$ cm$^{-3}$ and $1\times10^{18}$ cm$^{-3}$ respectively, the carrier concentration in the preparatory layer 23a, which will become the p-type diffusion barrier layer 23, is set within the range from $5\times10^{17}$ cm$^{-3}$ to $7\times10^{17}$ cm$^{-3}$ (both inclusive). In the present embodiment, the carrier concentration in the preparatory layer 23a is $5\times10^{17}$ cm$^{-3}$.

This sub-layer 17 does not receive the diffusion of the dopant from the cladding layer 19b above the sub-layer 17 so as to keep the carrier concentration as designed. Thus, the sub-layer 17 can keep the function as the current blocking layer, so that the efficiency of injecting a current into the active layer 12 can be improved as compared with the prior art.

If the carrier concentration in the preparatory layer 23a, which will become the p-type diffusion barrier layer 23, is set within the range from $5\times10^{17}$ cm$^{-3}$ to $7\times10^{17}$ cm$^{-3}$ (both inclusive), the carrier concentration in the preparatory layer 23a rises by the p-type dopant diffused from the p-type cladding layer 19 whose carrier concentration is $1\times10^{18}$ cm$^{-3}$. When the carrier concentration in the preparatory layer 23a becomes substantially the same as that in the p-type cladding layer 19, the diffusion comes to end so that the diffusion of the p-type dopant to the n-type sub-layer 17 below the preparatory layer 23a can be prevented. By this, the preparatory layer 23a is made into the p-type diffusion barrier layer 23. Also, the carrier concentration in the p-type diffusion barrier layer 23 becomes substantially the same as that in the p-type cladding layer 19, and consequently the p-type diffusion barrier layer 23 becomes a layer which substantially functions as a part of the p-type cladding layer in the semiconductor laser. Thus, the p-type diffusion barrier layer 23 has the function of restraining the p-type dopant from the p-type cladding layer 19 to the n-type sub-layer 17 when the cladding layer 19 is formed and the function of maintaining the effect as the current blocking layer of the n-type sub-layer 17 in the finished light emitting device. Furthermore, the p-type diffusion barrier layer 23 does not have any bad influence on the semiconductor laser because the layer 23 becomes a part of the p-type cladding layer 19.

For this reason, even if a large amount of a current, for example, a current of about 1 A, is injected into the InP—BH structure type semiconductor laser to obtain a high light output, the leak current which does not flow into the active layer 12 can be reduced and a current can be efficiently injected into the active layer 12. Thus, it is possible to improve efficiency of converting the injected current into light in the active layer 12.

As is evident from the above description, in the compound semiconductor light emitting device of the present invention, the p-type sub-layer and the n-type sub-layer constitute a current blocking layer, and, accordingly, have the function of confining carriers into the buried active layer. The p-type diffusion barrier layer is disposed between the n-type sub-layer and the p-type cladding layer; therefore, when the light emitting device is formed, the diffusion of the p-type dopant from the p-type cladding layer can be confined into the p-type diffusion barrier layer so that the diffusion of the p-type dopant to the n-type sub-layer can be restrained. For this reason, when the light emitting device is formed, the n-type sub-layer makes it possible to prevent extinction of n-type carriers caused by incorporation of the p-type dopant into the n-type sub-layer, and the drop in the carrier concentration. Thus, in the finished light emitting device, the n-type sub-layer can keep the function as a part of the current blocking layer, that is, keep the effect of confining the carriers into the active layer. As a result, the efficiency of injecting a current into the active layer can be improved, as compared with the prior art.

When the compound semiconductor light emitting device is produced, the p-type diffusion barrier layer can be formed in the second crystal growth step wherein the p-type and n-type InP sub-layers are formed. Therefore, increase in steps is unnecessary for forming the p-type diffusion barrier layer. As a result, the device can be easily produced.

Accordingly, in the compound semiconductor light emitting device of the present invention, it is possible to improve the efficiency of injecting a current into the active layer in a pnpn structure, which is a current blocking layer. For this reason, even if a large amount of a current, for example, a current of about 1 A, is injected into the device to obtain a high output, any leak current can be restrained and the aforementioned current can be efficiently injected into the active layer. Thus, it is possible to improve efficiency of converting the injected current into light in the active layer.

In the present embodiment, the active layer is a layer composed of the guide layers and the quantum well layer; however, the active layer is not limited to such a layer. The active layer may be any layer making it possible to confine carriers into the active layer itself by the current blocking layer and the cladding layer which surround the active layer.

In the present embodiment, the etching mask is made of a $SiO_2$ film but may be made of a SiN film. The p-type contact layer is made of InGaAs, but may be made of InGaAsP if the resistance of the device can be made so small that the device is used. The etching for making a mesa structure with an etching mask is wet etching in the present embodiment, but may be dry etching. In the present embodiment, the crystal growth step is carried out by using a vapor phase growth process, but is not limited to this process. The crystal growth step may be carried out by using a liquid phase growth process.

What is claimed is:

1. A process for producing a compound semiconductor light emitting device, comprising:
    the first crystal growth step of epitaxially growing an InGaAs active layer and a second conductive type, first InP cladding layer in turn on/over a first conductive type substrate;
    the step of disposing an etching mask in a stripe form on/over the second conductive type, first InP cladding layer, and etching an area uncovered with the etching mask to such a depth that the etching reaches the first conductive substrate;
    the second crystal growth step of epitaxially growing a second conductive type InP sub-layer, a first conductive type InP sub-layer, and a second conductive type InP diffusion barrier layer in turn on/over an uncovered area of the first conductive type substrate which is uncovered with the etching mask;
    the step of removing off the etching mask; and
    the third crystal growth step of epitaxially growing a second conductive type, second InP cladding layer and a second conductive type InGaAs contact layer in turn on/over uncovered upper surfaces of the second conductive type, first InP cladding layer and the second conductive type diffusion barrier layer.

2. A process for producing a compound semiconductor light emitting device according to claim 1, wherein a dopant for the first conductive type is $Si_2H_6$, and a dopant for the second conductive type is zinc (Zn).

3. A process for producing a compound semiconductor light emitting device according to claim 1, wherein the second conductive type InP diffusion barrier layer is formed by following substeps of:

forming a preparatory layer having a lower carrier concentration than the carrier concentration in the second conductive type, first InP cladding layer in the first crystal growth step, and diffusing the second conductive type dopant from the second conductive type, second InP cladding layer to the preparatory layer, when the second conductive type, second InP cladding layer is grown, whereby the carrier concentration in the preparatory layer is made the same or substantially the same as in the second conductive type, second InP cladding layer.

4. A process for producing a compound semiconductor light emitting device according to claim 1, wherein the second conductive type InP sub-layer, the first conductive type InP sub-layer, the second conductive InP cladding layer and the preparatory layer are formed so that the carrier concentrations in these layers will be $5 \times 10^{17}$ cm$^{-3}$, $1 \times 10^{18}$ cm$^{-3}$, $1 \times 10^{18}$ cm$^{-3}$, and from $5 \times 10^{17}$ to $7 \times 10^{17}$ cm$^{-3}$ (both inclusive), respectively.

5. A process for producing a compound semiconductor light emitting.device according to claim 1, wherein the preparatory layer is formed so that the carrier concentration therein will be $5 \times 10^{17}$ cm$^{-3}$.

6. A process for producing a compound semiconductor light emitting device according to claim 3, wherein when the second conductive type cladding layer is formed so that the carrier concentration therein will be $1 \times 10^{18}$ cm$^{-3}$, the second conductive type diffusion barrier layer is formed so that the carrier concentration therein will be $1 \times 10^{18}$ cm$^{-3}$ or about $1 \times 10^{18}$ cm$^3$.

7. A process for producing a compound semiconductor light emitting device according to claim 1, wherein a $SiO_2$ film or SiN film is used as the etching mask.

8. A process for producing a compound semiconductor light emitting device according to claim 1, wherein the crystal growth in the first crystal growth step, the second crystal growth step and the third crystal growth step is carried out by using a vapor phase growth or liquid phase growth process.

9. A process for producing a compound semiconductor light emitting device according to claim 1, wherein the first conductive type is an n-type, and the second conductive type is a p-type.

* * * * *